US007978106B1

(12) United States Patent
Wu et al.

(10) Patent No.: US 7,978,106 B1
(45) Date of Patent: Jul. 12, 2011

(54) INTERFERENCE DETECTION USING A MOVING WINDOW

(75) Inventors: Songping Wu, Cupertino, CA (US); Yui Lin, Cupertino, CA (US); Hui-Ling Lou, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/983,794

(22) Filed: Jan. 3, 2011

Related U.S. Application Data

(63) Continuation of application No. 12/157,255, filed on Jun. 9, 2008, now Pat. No. 7,864,091, which is a continuation of application No. 11/501,338, filed on Aug. 9, 2006, now Pat. No. 7,388,529.

(60) Provisional application No. 60/761,251, filed on Jan. 23, 2006.

(51) Int. Cl.
*H03M 1/62* (2006.01)
*H03M 1/84* (2006.01)

(52) U.S. Cl. .......................................... 341/139; 375/345

(58) Field of Classification Search .................. 341/139, 341/143, 155, 132, 118; 375/345, 346, 34; 455/67.13
See application file for complete search history.

(56) References Cited

U.S. PATENT DOCUMENTS

| | | | |
|---|---|---|---|
| 5,822,429 A | 10/1998 | Casabona et al. | |
| 5,930,310 A | 7/1999 | Freeman | |
| 6,240,283 B1 | 5/2001 | Holcombe | |
| 6,819,706 B1 | 11/2004 | Lim | |
| 6,864,817 B1 | 3/2005 | Salvi et al. | |
| 7,072,634 B2 | 7/2006 | Tillotson | |
| 7,113,758 B2 | 9/2006 | Kishi | |
| 7,388,529 B1 | 6/2008 | Wu et al. | |
| 7,623,052 B1 | 11/2009 | Wu et al. | |
| 7,773,014 B1 | 8/2010 | Wu et al. | |
| 7,864,091 B1 | 1/2011 | Wu et al. | |
| 2010/0329321 A1* | 12/2010 | Avellone et al. | 375/227 |

* cited by examiner

*Primary Examiner* — Peguy JeanPierre

(57) ABSTRACT

A receiver including an automatic gain control module, a digital signal processor module, and a control module. The automatic gain control module has a gain that varies from a nominal value in response to the receiver receiving an input signal. The automatic gain control module is configured to generate a first signal in response to the gain settling at a value different from the nominal value. In response to the input signal not being an interference signal, the digital signal processor module is configured to process the input signal and generate a second signal. Subsequent to the first signal being generated and prior to the second signal being generated, the control module is configured to determine whether the input signal is an interference signal based on whether the second signal is generated within a predetermined time period subsequent to the first signal being generated.

16 Claims, 14 Drawing Sheets

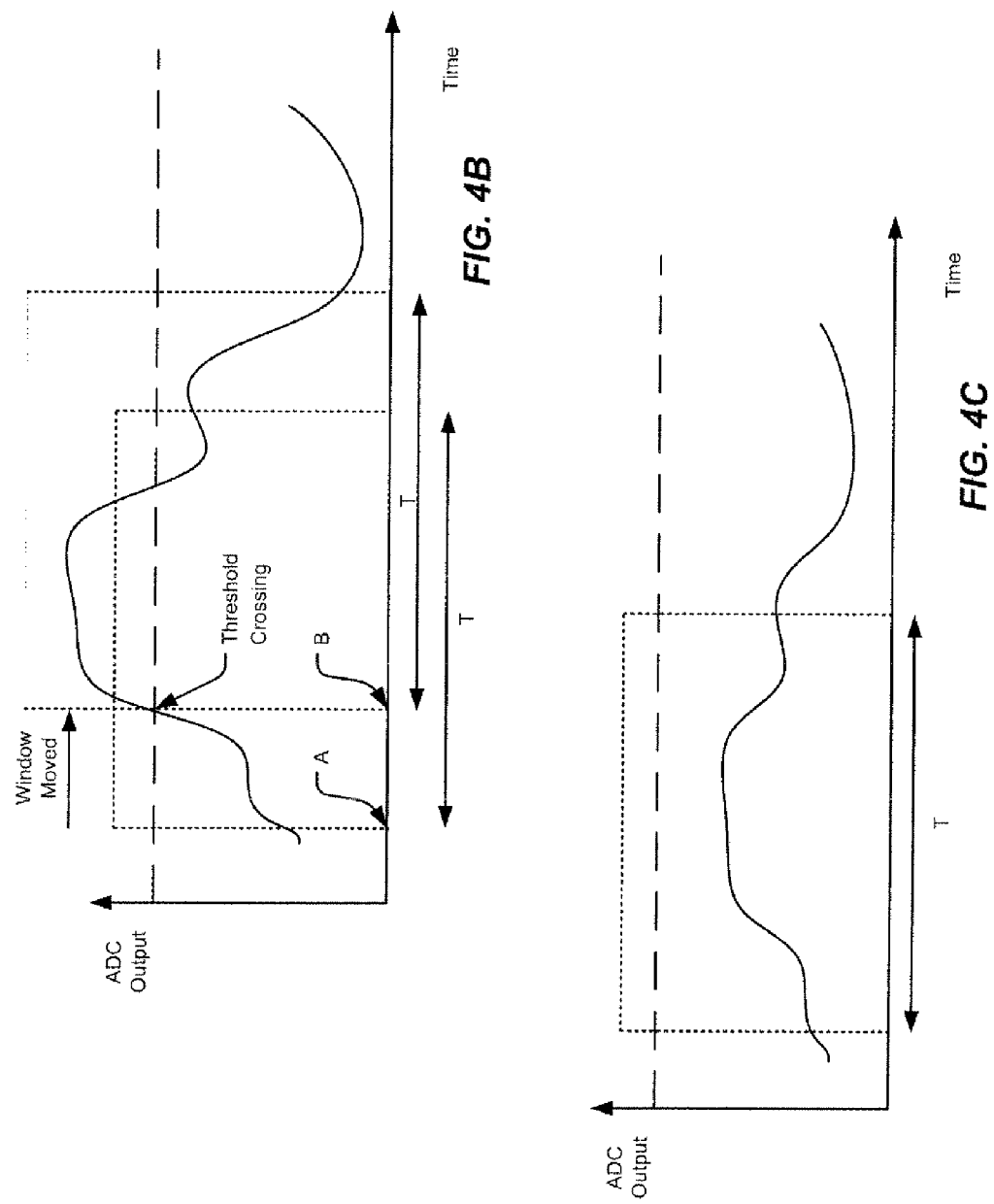

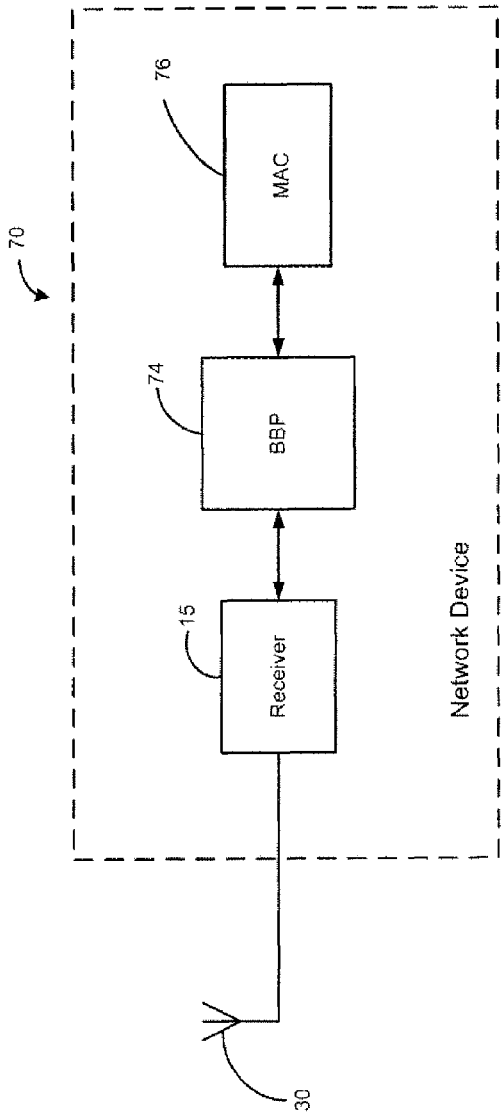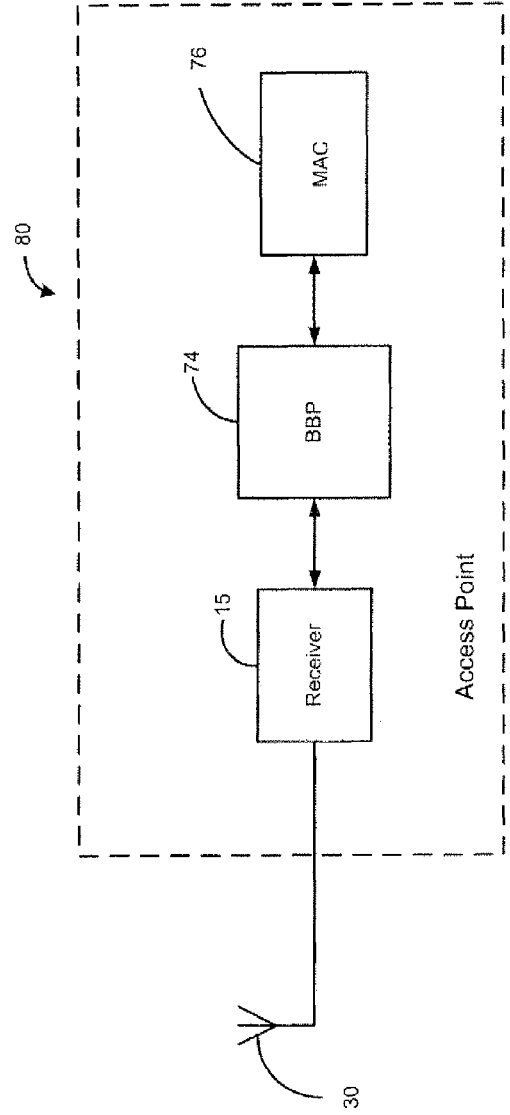

INTERFERENCE DETECTION USING A MOVING WINDOW

CROSS-REFERENCE TO RELATED APPLICATIONS

This application is a continuation of U.S. application Ser. No. 12/157,255, filed Jun. 9, 2008, which is a continuation of U.S. application Ser. No. 11/501,338, filed Aug. 9, 2006, which claims the benefit of U.S. Provisional Application No. 60/761,251, filed Jan. 23, 2006. The disclosures of the applications referenced above are incorporated herein by reference.

FIELD

The present disclosure relates to communication systems, and more particularly to systems and methods for detecting interference in communication systems.

BACKGROUND

The background description provided herein is for the purpose of generally presenting the context of the disclosure. Work of the presently named inventors, to the extent it is described in this background section, as well as aspects of the description which may not otherwise qualify as prior art at the time or filing, are neither expressly nor impliedly admitted as prior art against the present disclosure.

Communication systems typically comprise transmitters that transmit data over a communication channel and receivers that receive data transmitted by transmitters. Often, receivers receive data that may be corrupted due to co-channel interference (CCI) and/or adjacent channel interference (ACI). CCI may be caused by a signal operating on the same channel that carries data. On the other hand, ACI may be caused by a signal operating in a channel that is adjacent to a channel carrying data.

Interference may distort data. That is, data received by receivers may not represent data transmitted by transmitters due to interference. Consequently, receivers may not accurately interpret and process received data resulting in partial or total data loss. This can degrade system performance and may cause system malfunction.

Referring now to FIGS. 1A-1B, a receiver 10 typically comprises an antenna 30, an automatic gain control (AGC) module 32, a mixer module 33, and a local oscillator module 33-1. The receiver 10 further comprises a filter module 34, an analog-to-digital converter (ADC) module 36, and a digital signal processor (DSP) module 38.

The antenna 30 receives an input signal. The AGC module 32 has a gain that varies based strength of the input signal. The mixer module 33 mixes a signal generated by the local oscillator module 33-1 with the input signal. The filter module 34 filters an output of the mixer module 33. The ADC module 36 converts an output of the filter module 34 from analog to digital format. The DSP module 38 processes an output of the ADC module 36.

Additionally, the receiver 10 typically comprises a peak detector module 40 that generates a peak-detect signal when the output of the AGC module 32 crosses a predetermined threshold in response to the input signal. The predetermined threshold is generally based on characteristics such as packet size, packet length, strength of the input signal, etc. The peak detector module 40 may generate the peak-detect signal when the AGC module 32 determines that the input signal strength exceeds a relative signal strength index (RSSI).

The peak-detect signal activates the DSP module 38. The DSP module 38 generates a gain-drop signal that drops the gain of the AGC module 32 as shown in FIG. 1B. The gain of the AGC module 32 remains low for the duration of the input signal. The duration of the input signal depends on characteristics such as packet size, packet length, etc. The gain of the AGC module 32 returns to normal at the end of the input signal.

On the other hand, an interference signal may trigger a false alarm. That is, the interference signal may cause the peak detector module 40 to mistake the interference signal as data. The peak detector module 40 may generate the peak-detect signal when the input signal is an interference signal. Subsequently, the DSP module 38 may generate the gain-drop signal that will drop the gain of the AGC module 32. The gain of the AGC module 32, however, may not return to normal since the interference signal may have unknown and/or unknowable characteristics. This can cause system malfunction and/or data loss.

SUMMARY

A system and method for processing an input signal at a receiver. The method includes generating a first signal in response to a gain of an automatic gain control module settling at a value different from a nominal value, wherein the gain of the automatic gain control module varies from the nominal value in response to the receiver module receiving the input signal; in response to the input signal not being an interference signal, processing the input signal to generate a second signal; and subsequent to the first signal being generated and prior to the second signal being generated, determining whether the input signal is an interference signal based on whether the second signal is generated within a predetermined time period subsequent to the first signal being generated.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the invention, are intended for purposes of illustration only and are not intended to limit the scope of the disclosure.

BRIEF DESCRIPTION OF THE DRAWINGS

The present disclosure will become more fully understood from the detailed description and the accompanying drawings.

FIGS. 4B and 4C are graphs of output of an ADC module relative to time.

FIG. 6A is a functional block diagram of an exemplary implementation of at least one of the receivers of FIGS. 2A-2B in a wireless network device.

FIG. 6B is a functional block diagram of an exemplary implementation of at least one of the receivers of FIGS. 2A-2B in an access point.

DETAILED DESCRIPTION

Figure 1A:
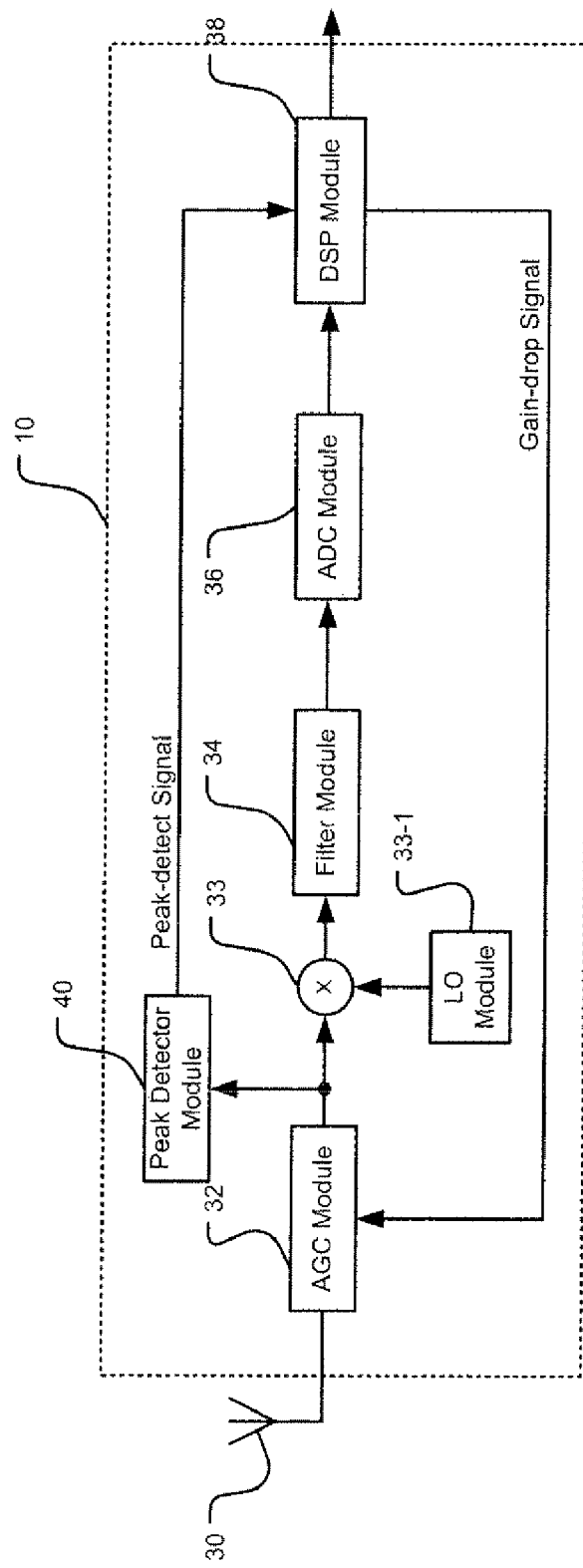
FIG. 1A is a functional block diagram of an exemplary receiver according to the prior art.
Figure 1B:
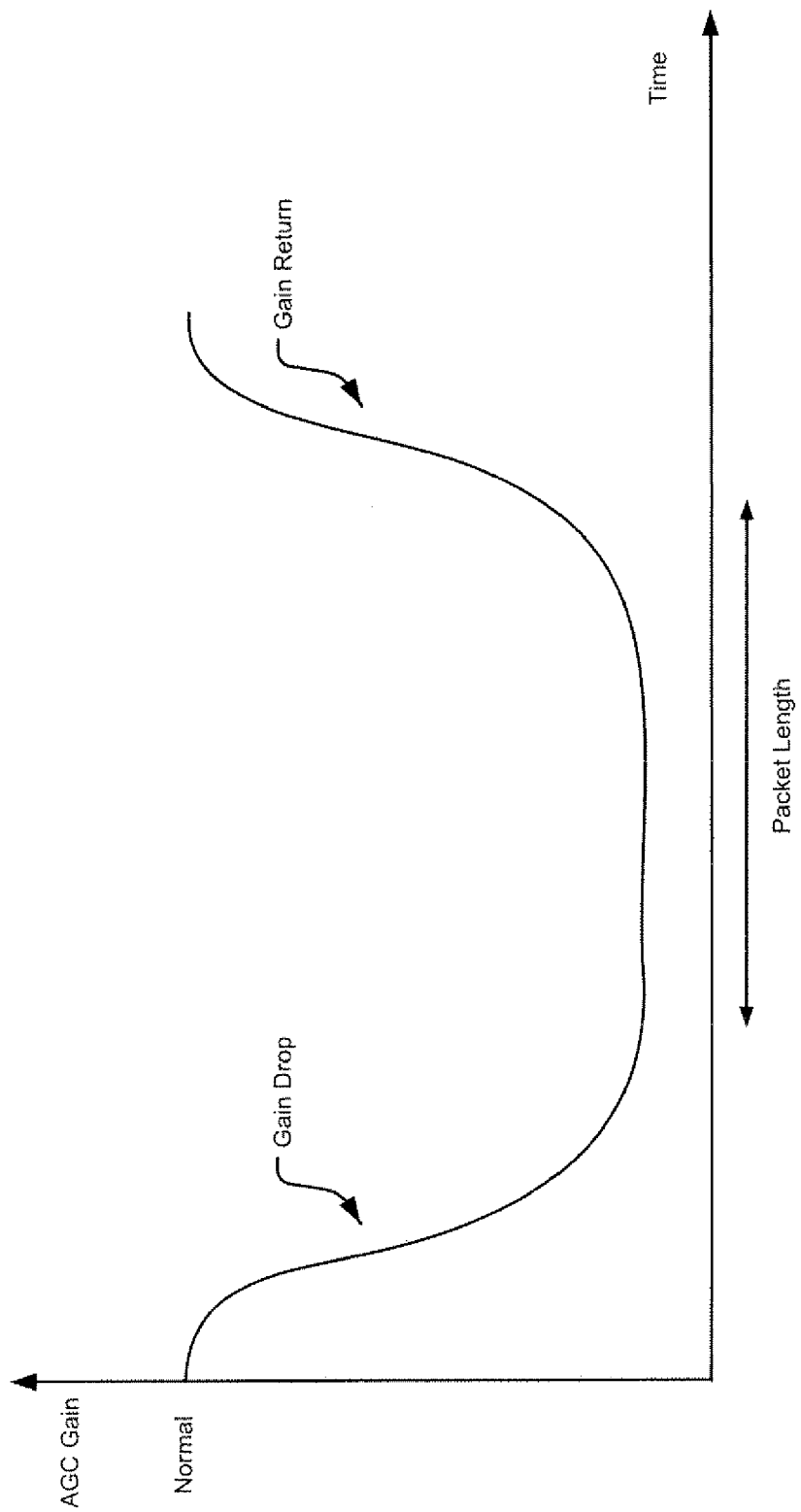
FIG. 1B is an exemplary graph of gain of an automatic gain control (AGC) module relative to time.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 2A:
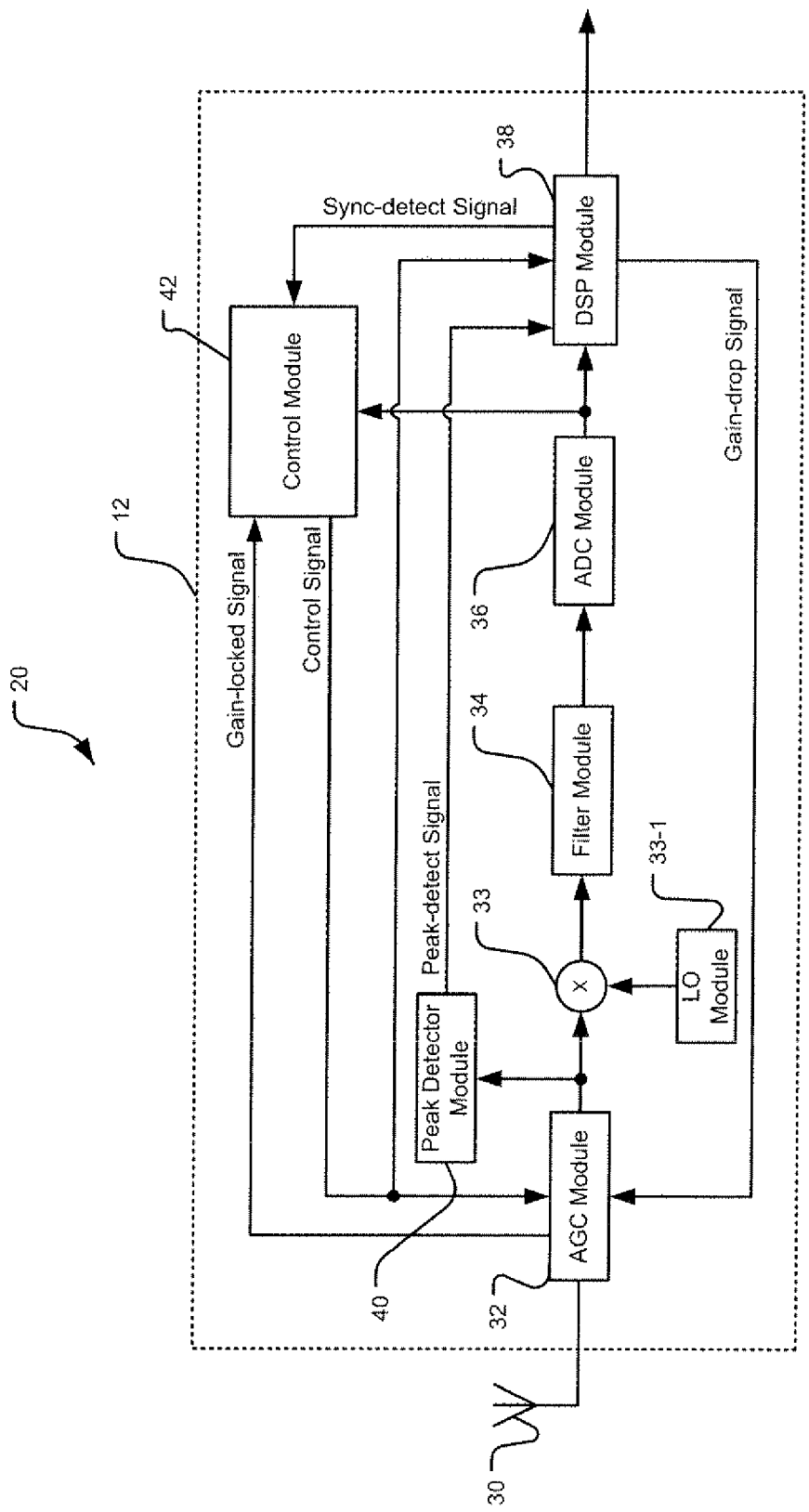
FIG. 2A is a functional block diagram of an exemplary receiver that detects interference according to the present disclosure.
Figure 2B:
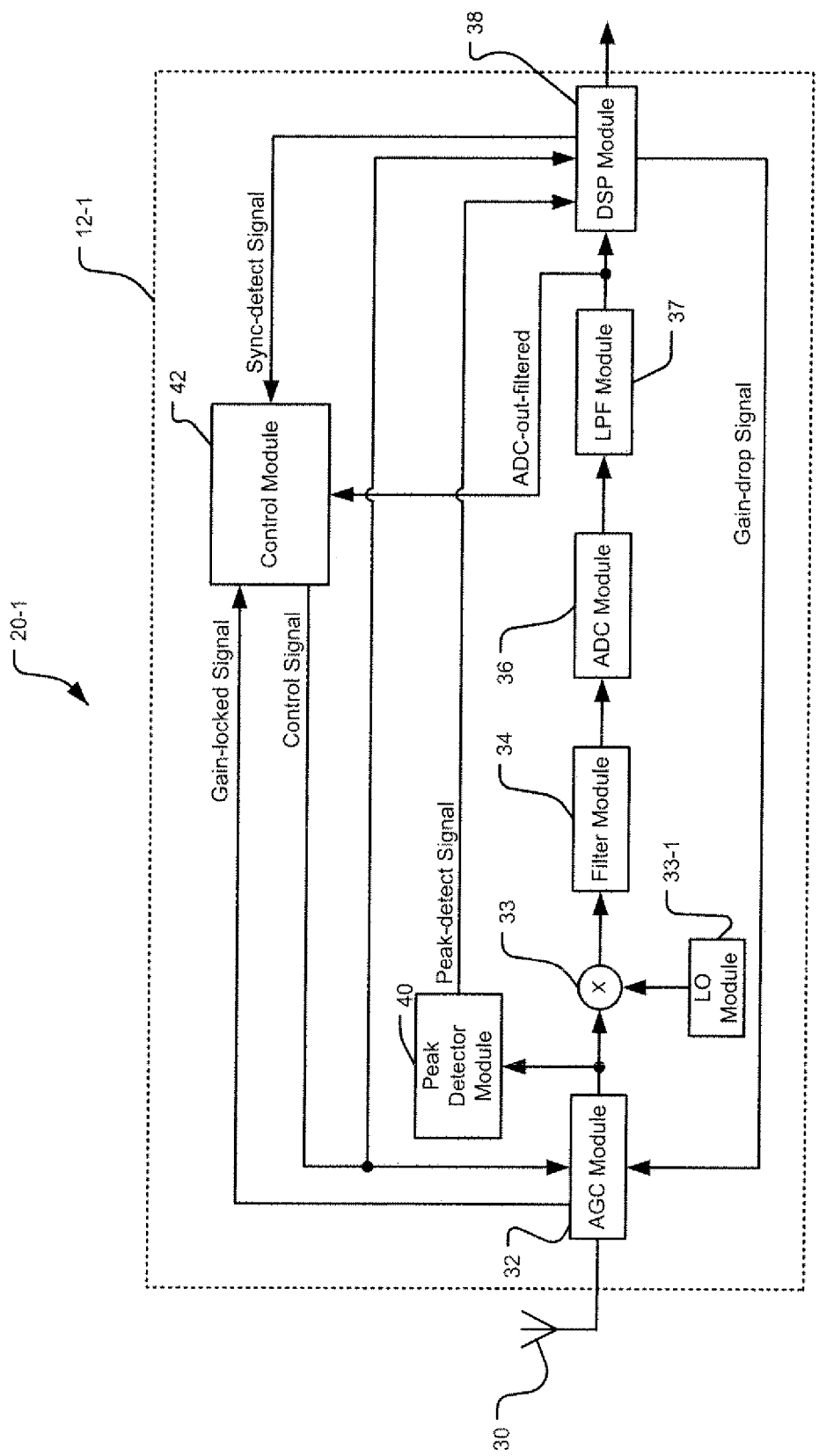
FIG. 2B is a functional block diagram of an exemplary receiver that detects interference according to the present disclosure.

Referring now to FIGS. 2A-2B, a system 20 for detecting interference in a receiver 12 (shown in FIG. 2A) comprises an antenna 30, an automatic gain control (AGC) module 32, a mixer module 33, and a local oscillator module 33-1. The system 20 further comprises a filter module 34, an analog-to-digital converter (ADC) module 36, a digital signal processor (DSP) module 38, a peak detector module 40, and a control module 42.

FIG. 2B shows a system 20-1 for detecting interference in a receiver 12-1. The receiver 12-1 of the system 20-1 comprises all the modules of the receiver 12 of the system 20. Additionally, the receiver 12-1 of the system 20-1 comprises a low-pass filter (LPF) module 37 that filters an output of the ADC module 36 and generates a filtered ADC output shown as an ADC-out-filtered signal in FIG. 2B.

The LPF module 37 inputs the filtered ADC output to the DSP module 38 and to the control module 42. The LPF module 37 reduces effects of noise and reduces a probability of false alarms that may be caused by the noise. False alarms occur when the system 20-1 misinterprets an interference signal as data.

Throughout this disclosure, references to system 20 should be understood as referring to system 20 and system 20-1, references to receiver 12 should be understood as referring to receiver 12 and receiver 12-1, and references to the output of the ADC module 36 should be understood as referring to the output of at least one of the ADC module 36 and the LPF module 37.

Referring now to FIG. 2A, the antenna 30 receives an input signal. The AGC module 32 has a gain that varies based on strength of the input signal. The mixer module 33 mixes a signal generated by the local oscillator module 33-1 with the input signal. The filter module 34 filters an output of the mixer module 33. The ADC module 36 converts an output of the filter module 34 from an analog to a digital format. The DSP module 38 processes the output of the ADC module 36.

The peak detector module 40 generates a peak-detect signal when the output of the AGC module 32 crosses a predetermined threshold in response to the input signal. The predetermined threshold is generally based on characteristics such as packet size, packet length, strength of the input signal, etc. Additionally, the peak detector module 40 may generate the peak-detect signal when the AGC module 32 determines that the signal strength of the input signal exceeds a relative signal strength index (RSSI).

The peak-detect signal activates the DSP module 38. The DSP module 38 generates a gain-drop signal that drops the gain of the AGC module 32. The gain of the AGC module 32 remains low for the duration of the input signal. The duration of the input signal depends on characteristics such as packet size, packet length, etc. The gain of the AGC module 32 returns to normal at the end of the input signal. The DSP module 38 processes a preamble in a packet of data in the input signal and generates a sync-detect signal. When the control module 42 receives the sync-detect signal, the control module 42 sets a sync-detect flag.

Figure 3A:
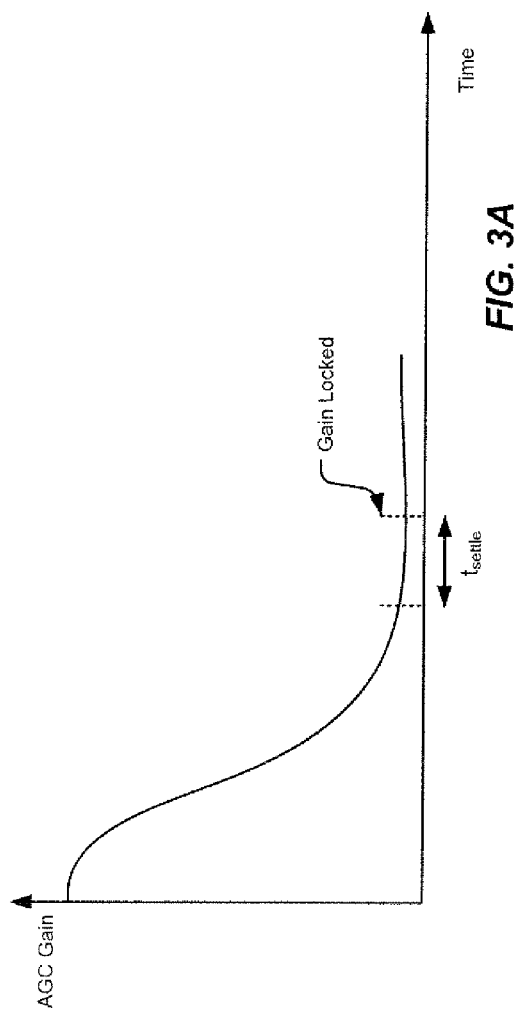
FIG. 3A is a graph of gain of an automatic gain control (AGC) module relative to time.

The control module 42 detects interference and distinguishes interference from data. Referring now to FIG. 3A, after the input signal is received, the gain of the AGC module 32 normally settles down within a predetermined time called a settling time $t_{settle}$. $t_{settle}$ of the AGC module 32 is generally a known design parameter. If the gain of the AGC module 32 settles down within a time that is less than or equal to $t_{settle}$, the AGC module 32 generates a gain-locked signal. When the control module 42 receives the gain-locked signal from the AGC module 32, the control module 42 sets a gain-locked flag.

Figure 3B:
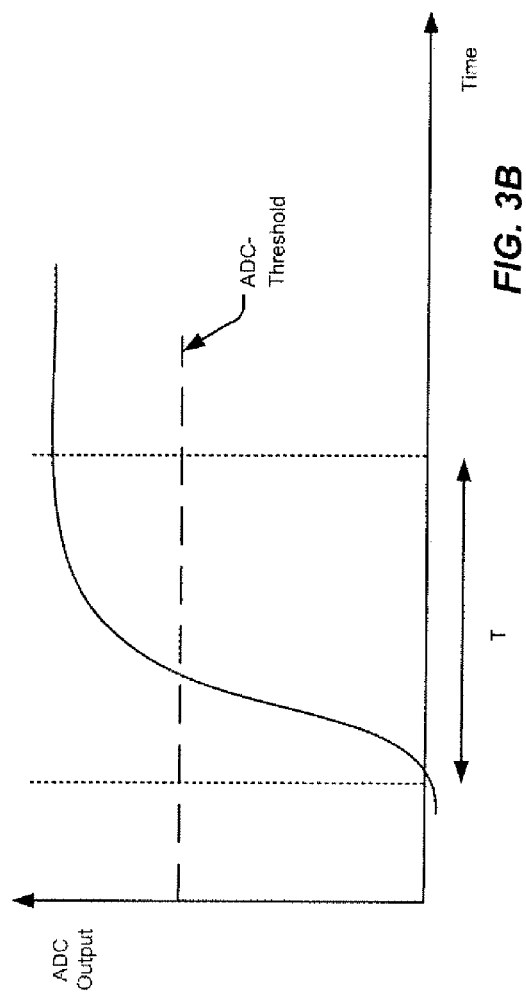
FIG. 3B is a graph of output of an analog-to-digital (ADC) converter module relative to time.

Referring now to FIG. 3B, when the gain-locked flag is set but the sync-detect flag is not set, the control module 42 begins interference detection. The control module 42 monitors the output of the ADC module 36 for a predetermined time T. The control module 42 determines whether the output of the ADC module 36 exceeds a predetermined ADC-threshold during time T. The ADC threshold can be set based on characteristics of the input signal such as packet size, packet length, etc.

Specifically, the control module 42 utilizes a counter or a timer that counts time T. The counter serves as a timing window of duration T. If the ADC-threshold is exceeded within time T, the control module 42 resets the counter. That is, the counter restarts counting time T. In other words, when the counter is reset, the timing window is effectively moved from an initial position to a new position at which the ADC-threshold is exceeded. The control module 42 checks whether the sync-detect flag is set before the time T expires. If the sync-detect flag is set, the control module 42 determines that the input signal is data instead of interference.

On the other hand, if the control module 42 finds after the time T has expired that the sync-detect flag is not set, the control module 42 determines that the input signal is interference instead of data. The control module 42 generates a control signal that resets the receiver 12. Specifically, the control signal resets the DSP module 38 and/or the gain of the AGC module 32. Additionally, the control module 42 resets the gain-locked flag. Thus, the AGC module 32 can respond to subsequent input signals that the receiver 12 may receive.

The control module 42 thus prevents a malfunction of the receiver 12 that may be caused by the interference. The control module 42 prevents subsequent data loss by resetting the gain of the AGC module 32 when the input signal is interference instead of data. The time T can be tailored to increase or decrease the speed of interference detection. Additionally, using a combination of the gain-locked signal and the sync-detect signal decreases a rate of false alarms and increases a probability of interference detection.

Figure 3C:
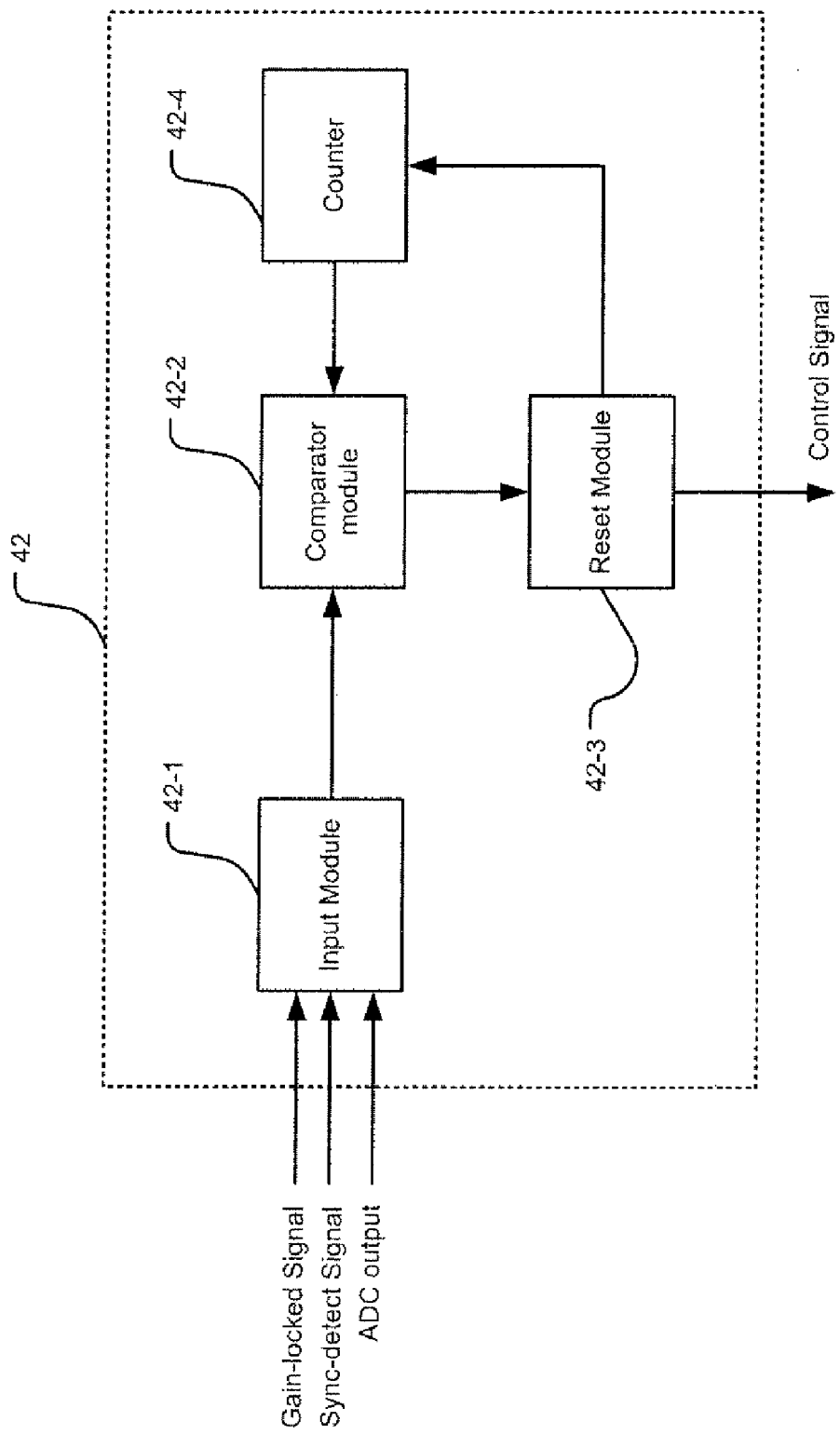
FIG. 3C is a functional block diagram of a control module for the receiver of FIGS. 2A and 2B.

Referring now to FIG. 3C, the control module 42 comprises an input module 42-1, a comparator module 42-2, a reset module 42-3, and a counter 42-4. The input module 42-1 receives an input that is the output of the ADC module 36 or the LPF module 37. Additionally, the input module 42-1 receives the gain-locked signal and the sync-detect signal. The comparator module 42-2 compares the amplitude of the input to the ADC-threshold when the input module 42-1 receives the gain-locked signal but does not receive the sync-detect signal. The counter 42-4 starts counting the predetermined time T when the comparator module 42-2 begins comparing the amplitude.

If the amplitude exceeds the ADC-threshold within time T, the reset module 42-3 resets the counter 42-4, and the counter 42-4 begins counting time T afresh. If the input module 42-1 does not receive the sync detect signal within time T (original or fresh count), the control module 42 determines that the input signal is interference instead of data, and the reset module 42-3 generates the control signal. If, however, the input module 42-1 receives the sync detect signal within time T (original or fresh count), the control module 42 determines that the input signal is data instead of interference.

Figure 4A:
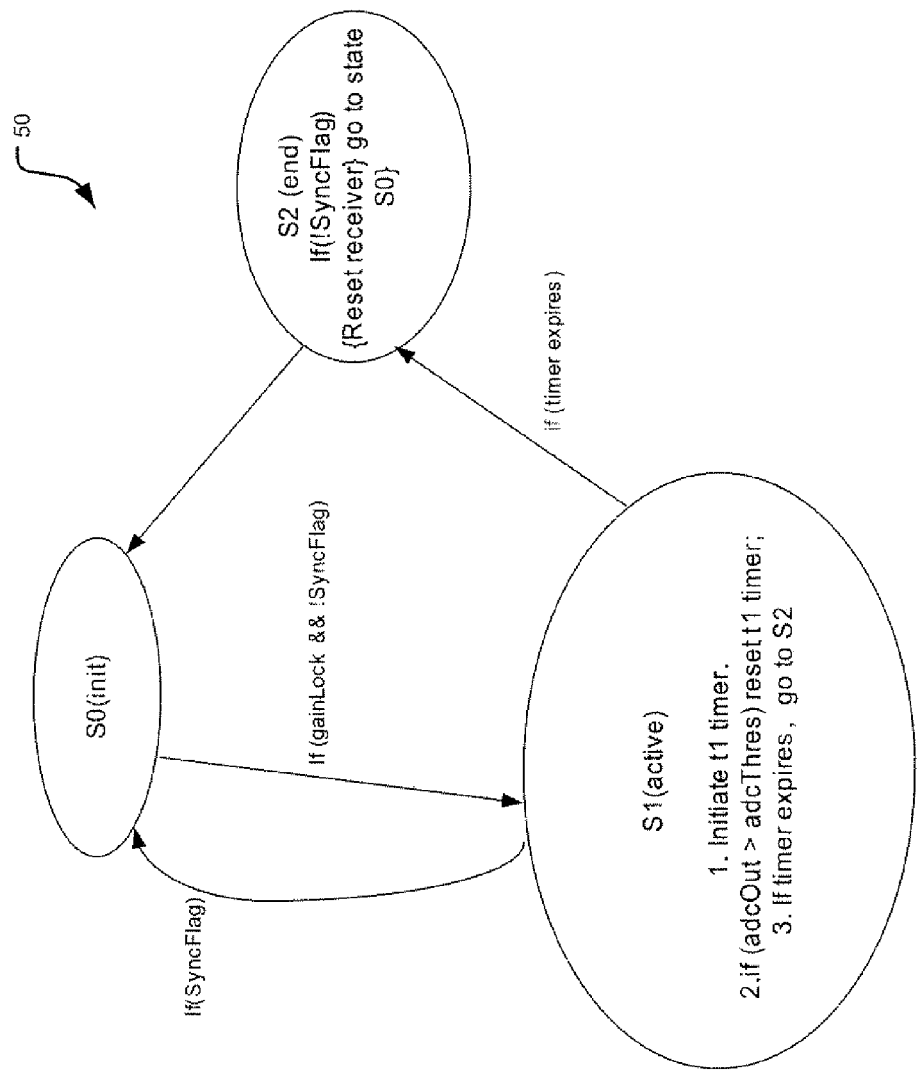
FIG. 4A is a state diagram of a state machine that detects interference in at least one of the receivers of FIGS. 2A-2B according to the present disclosure.

Referring now to FIGS. 4A-4C, a state machine 50 that detects interference comprises three states: an initial or inactive state S0, a monitoring or active state S1, and an end state S2. The state machine 50 is in the initial state when the gain-locked flag and the sync-detect flag are set. When the control module 42 finds that the gain-locked flag is set but the sync-detect flag is not set, the state machine 50 transitions from state S0 to state S1.

In state S1, the control module 42 initializes a counter that counts a predetermined time T. The counter functions as a timing window of time duration T. During the timing window, the control module 42 monitors the output of the ADC module 36. If the output of the ADC module 36 exceeds the ADC-threshold before time T expires, the control module 42 resets the counter, and the counter begins to count time T afresh.

As shown in FIG. 4B, this is equivalent to moving the timing window from an initial position A to a new position B wherein the new position B is a point in time at which the output of the ADC module 36 exceeds the ADC-threshold. On the other hand, the output of the ADC module 36 may not exceed during the time T as shown in FIG. 4C. In that case, the timing window is not moved. That is, the counter is not reset.

While the counter counts the time T afresh (or the original time T if the ADC-threshold is not exceeded), the control module 42 checks whether the sync-detect flag is set before the time T expires. If the control module 42 finds that the sync-detect flag is set before the time T expires, the control module 42 determines that the DSP module 38 generated the sync-detect signal based on a valid data packet and that the input signal is not an interference signal. The state machine 50 returns to state S0.

If, however, the control module 42 finds that the time T has expired and the sync-detect flag is not set after the time T has expired, the state machine 50 transitions to state S2. The control module 42 determines that the input signal is interference instead of data. The control module 42 generates a control signal that resets the receiver 12. Specifically, the control signal resets the DSP module 38 and/or the gain of the AGC module 32. Additionally, the control module 42 resets the gain-locked flag. The state machine 50 transitions to state S0.

Figure 5:
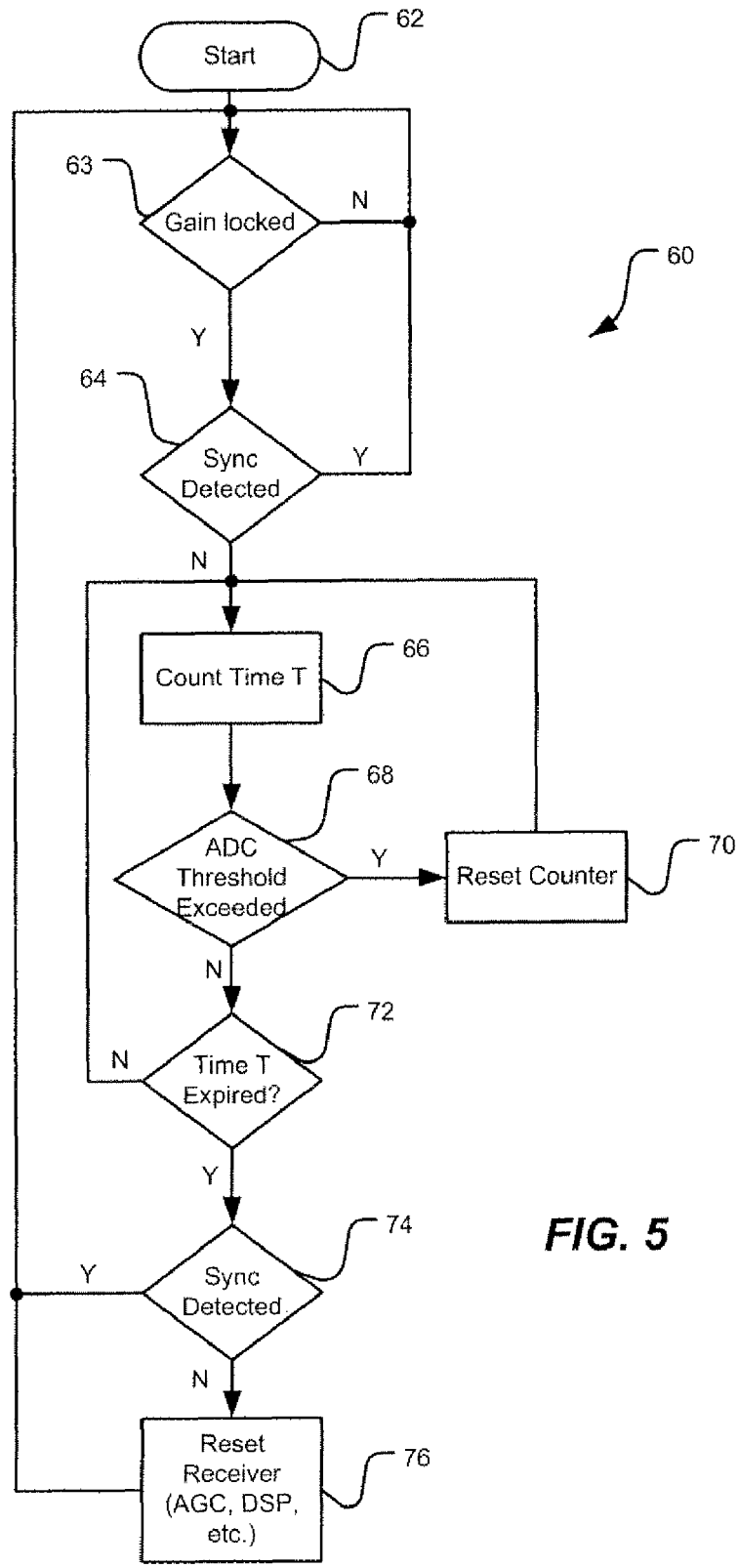
FIG. 5 is a flowchart of a method for detecting interference according to the present disclosure.

Referring now to FIG. 5, a method 60 for detecting interference begins at step 62. The control module 42 checks in step 63 whether the gain-locked flag is set. If false, the method 60 returns to step 62. If true, the control module 42 checks in step 64 whether the sync-detect flag is set. If true, the control module determines that the input signal is data instead of interference, and the method 60 returns to step 62.

If false, the control module 42 starts a counter in step 66 that counts time T. The control module 42 checks in step 68 whether the output of the ADC module 36 exceeds a predetermined ADC-threshold. If true, the control module 42 resets the counter in step 70, and the method 60 returns to step 66. If false, the control module checks in step 72 if the time T expired. If false, the method 60 returns to step 66. If true, the control module 42 checks in step 74 if the sync-detect flag is set. If true, control module 42 determines that the input signal is data instead of interference, and the method 60 returns to step 62. If false, the control module 42 determines that the input signal is interference instead of data and generates a control signal that resets the receiver 12 by resetting the DSP module 38 and/or the gain of the AGC module 32 including the gain-locked flag in step 76. The method 60 returns to step 62.

Figure 6C:
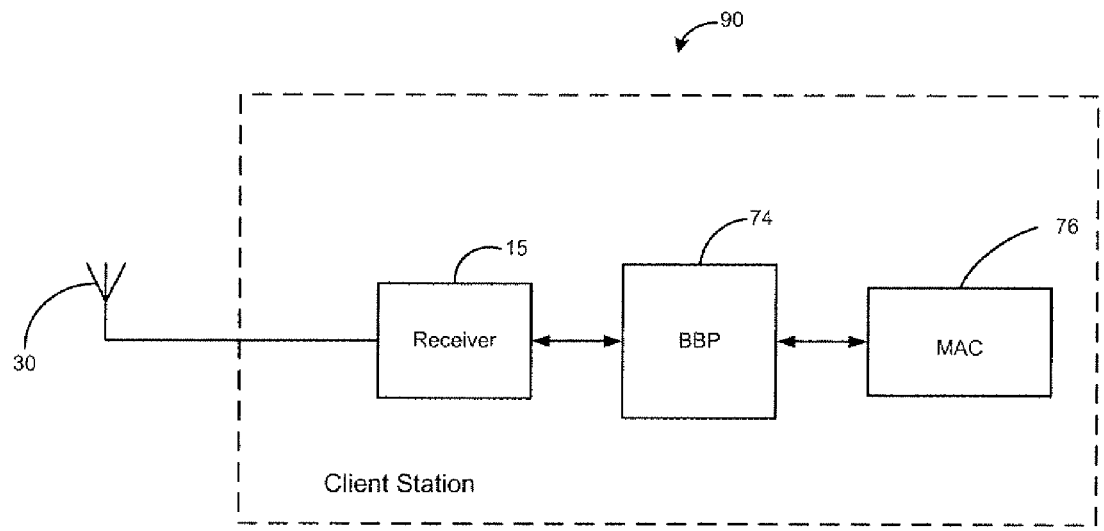
FIG. 6C is a functional block diagram of an exemplary implementation of at least one of the receivers of FIGS. 2A-2B in a client station.

Referring now to FIGS. 6A-6E, various exemplary implementations of the receiver module 15 are shown. FIG. 6A shows an exemplary implementation of the receiver module 15 in a wireless network device 70. In some implementations, some modules of the receiver module 15 may be implemented in a baseband processor (BBP) 74 while some other modules of the receiver module 15 may be implemented in a medium access controller (MAC) 76 of the wireless network device 70. FIGS. 6B-6C show exemplary implementations of the receiver module 15 in a wireless access point 80 and a wireless client station 90, respectively.

Figure 6D:
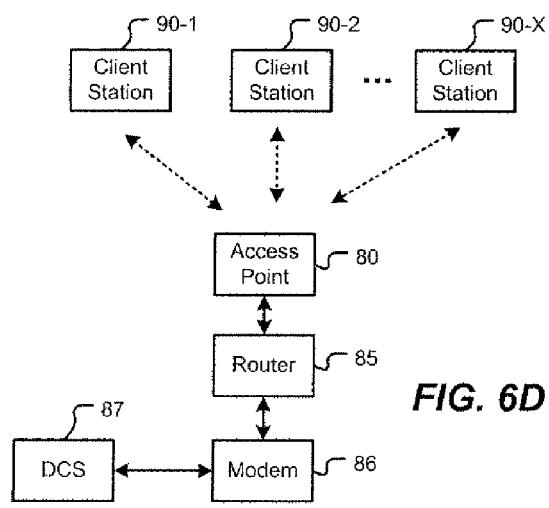
FIGS. 6D-6E are functional block diagrams of exemplary wireless networks respectively operating in an infrastructure mode and an ad-hoc mode.
Figure 6E:
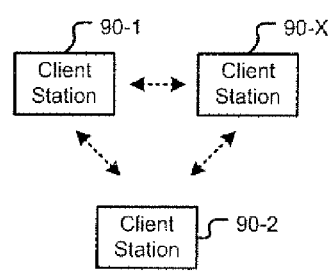

In FIG. 6D, an infrastructure network is shown with wireless client stations 90-1, 90-2, . . . , and 90-X that communicate with an access point 80. The access point 80 may communicate with a router 85. A modem 86 may provide access to a distributed communications system (DCS) 87 such as the Internet, a wide area network (WAN), and/or a local area network (LAN). In FIG. 6E, the client stations 90-1, 90-2, . . . , and 90-X are configured in an ad hoc mode.

Figures 7A, 7B:
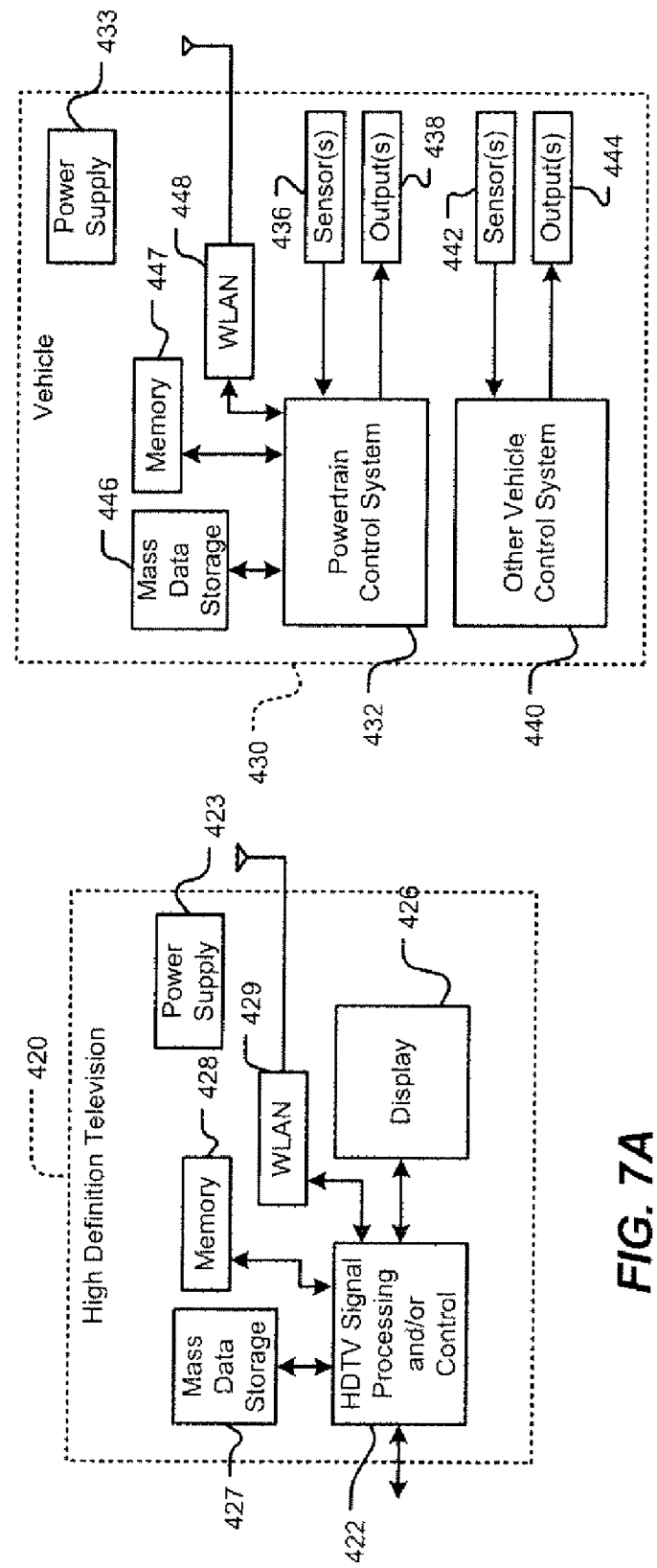
FIG. 7A is a functional block diagram of a high definition television.
FIG. 7B is a functional block diagram of a vehicle control system.

Referring now to FIGS. 7A-7E, various exemplary implementations of the system 20 are shown. Referring now to FIG. 7A, the system 20 can be implemented in a WLAN network interface 429 of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via the WLAN network interface 429.

Referring now to FIG. 7B, the system 20 may be implemented in a WLAN network interface 448 of a control system of a vehicle 430. In some implementations, a powertrain control system 432 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

Another control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via the WLAN network interface 448. The control system 440 may also include mass data storage, memory and/or a WLAN interface (all not shown).

Figure 7C:
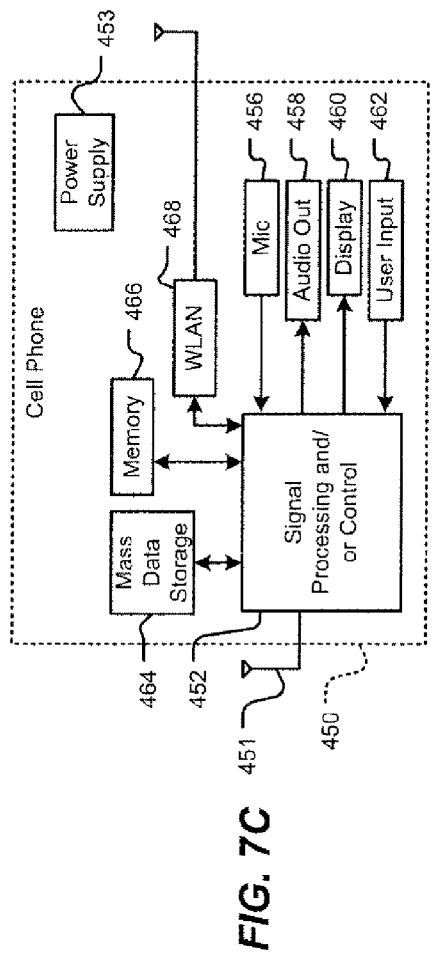
FIG. 7C is a functional block diagram of a cellular phone.

Referring now to FIG. 7C, the system 20 can be implemented in a WLAN network interface 468 of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via the WLAN network interface 468.

Figure 7D:
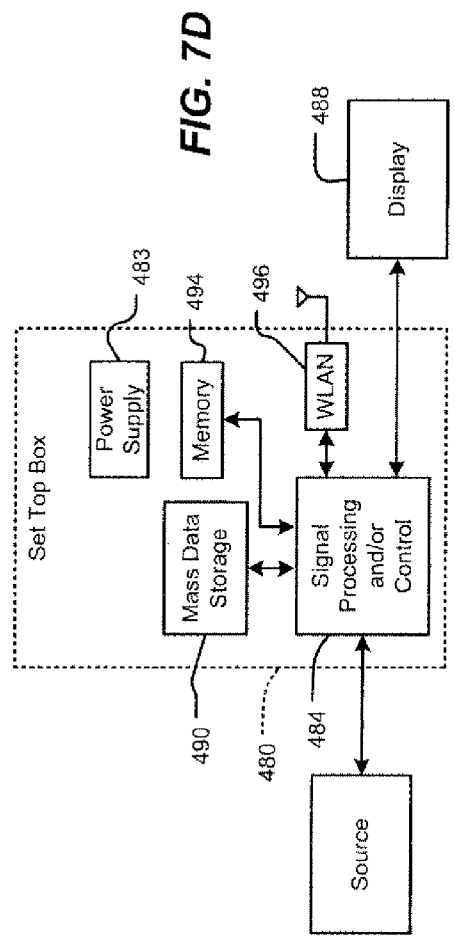
FIG. 7D is a functional block diagram of a set top box.

Referring now to FIG. 7D, the system 20 can be implemented in WLAN network interface 496 of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via the WLAN network interface 496.

Figure 7E:
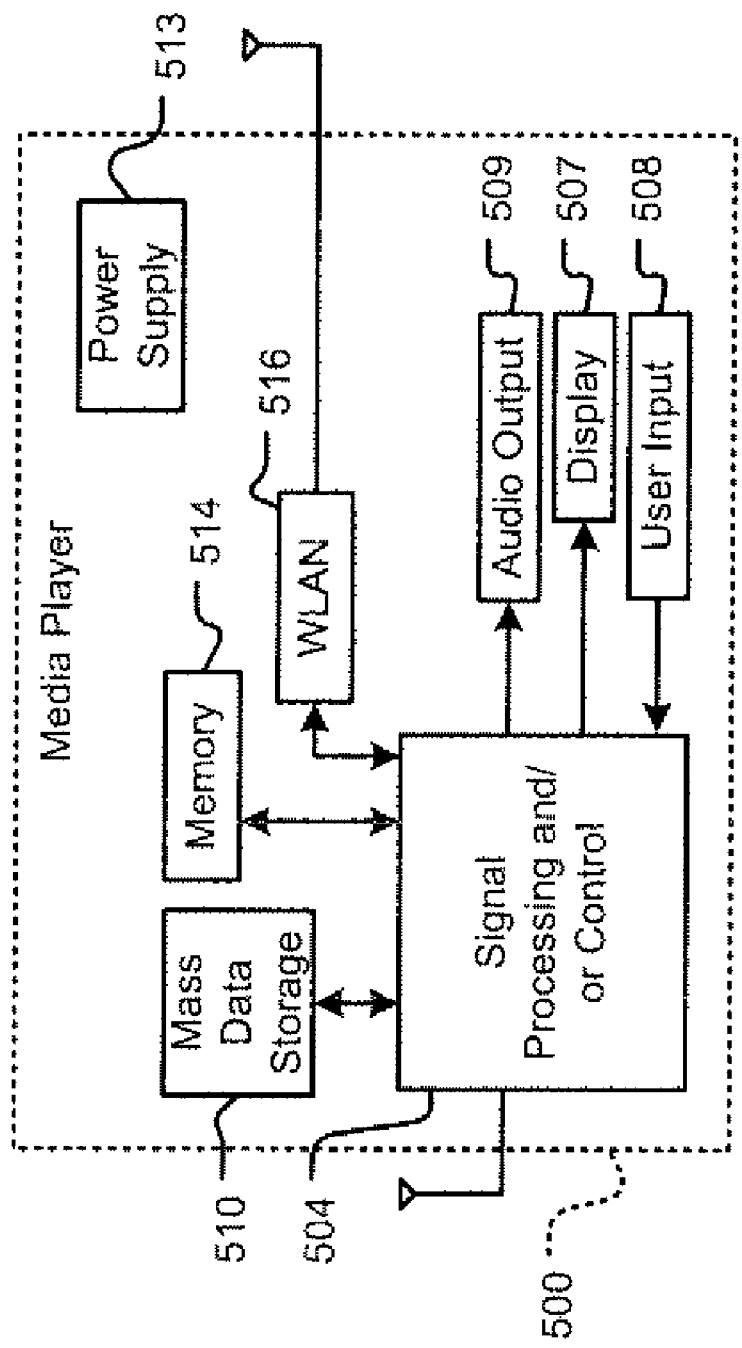
FIG. 7E is a functional block diagram of a media player.

Referring now to FIG. 7E, the system 20 can be implemented in a WLAN network interface 516 of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via the WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A receiver comprising:
   an automatic gain control module having a gain that varies from a nominal value in response to the receiver receiving an input signal, the automatic gain control module configured to generate a first signal in response to the gain settling at a value different from the nominal value;

a digital signal processor module, wherein in response to the input signal not being an interference signal, the digital signal processor module is configured to process the input signal and generate a second signal; and a control module, wherein subsequent to the first signal being generated and prior to the second signal being generated, the control module is configured to determine whether the input signal is an interference signal based on whether the second signal is generated within a predetermined time period subsequent to the first signal being generated.

2. The receiver of claim 1, wherein the control module is configured to determine the input signal to be an interference signal in response to the second signal not being generated within the predetermined time period subsequent to the first signal being generated.

3. The receiver of claim 2, further comprising an analog-to-digital converter module in communication with the automatic gain control module, wherein the analog-to-digital converter module is configured to generate an output that is input to each of the control module and the digital signal processor module.

4. The receiver of claim 3, wherein the control module is configured to determine whether the output of the analog-to-digital converter module is greater than a predetermined threshold during the predetermined time period.

5. The receiver of claim 4, wherein the control module is configured to reset the predetermined time period in response to the output of the analog-to-digital converter module being greater than the predetermined threshold.

6. The receiver of claim 5, wherein the control module is configured to determine the input signal to not be an interference signal in response to:
   the output of the analog-to-digital converter module being greater than the predetermined threshold during the predetermined time period; and
   the second signal being generated during the predetermined time period.

7. The receiver of claim 4, wherein the control module is configured to determine the input signal to be an interference signal in response to:
   the output of the analog-to-digital converter module being less than the predetermined threshold during the predetermined time period; and
   the second signal not being generated during the predetermined time period.

8. The receiver of claim 3, further comprising a filter module configured to filter the output of the analog-to-digital converter module prior to the output of the analog-to-digital converter module being received by each of the control module and the digital signal processor module.

9. The receiver of claim 1, wherein the digital signal processor module is configured to generate the second signal based on a predetermined synchronization pattern within the input signal.

10. The receiver of claim 1, wherein the control module is configured to reset the gain of the automatic gain control module in response to the input signal being determined to be an interference signal.

11. A device comprising the receiver of claim 1.

12. The device of claim 11, further comprising:
   a baseband processor in communication with the receiver; and
   a medium access controller (MAC) in communication with the baseband processor.

13. The device of claim 12, wherein the device comprises a network device, a client station, or an access point.

14. A method for processing an input signal at a receiver, the method comprising:
   generating a first signal in response to a gain of an automatic gain control module settling at a value different from a nominal value, wherein the gain of the automatic gain control module varies from the nominal value in response to the receiver receiving the input signal;
   in response to the input signal not being an interference signal, processing the input signal to generate a second signal; and
   subsequent to the first signal being generated and prior to the second signal being generated, determining whether the input signal is an interference signal based on whether the second signal is generated within a predetermined time period subsequent to the first signal being generated.

15. The method of claim 14, further comprising determining the input signal to be an interference signal in response to the second signal not being generated within a predetermined time period subsequent to the first signal being generated.

16. The method of claim 15, further comprising resetting gain of the automatic gain control module in response to the input signal being determined to be an interference signal.

* * * * *